United States Patent
Siu et al.

(10) Patent No.: US 11,731,145 B2
(45) Date of Patent: Aug. 22, 2023

(54) MULTIPLE SECTION SHOWERHEAD ASSEMBLY

(71) Applicant: PIOTECH INC., Shenyang (CN)

(72) Inventors: Gregory Siu, Shenyang (CN); Junichi Arami, Shenyang (CN)

(73) Assignee: PIOTECH INC., Shenyang (CN)

( * ) Notice: Subject to any disclaimer, the term of this patent is extended or adjusted under 35 U.S.C. 154(b) by 316 days.

(21) Appl. No.: 15/930,594

(22) Filed: May 13, 2020

(65) Prior Publication Data

US 2020/0360943 A1    Nov. 19, 2020

(30) Foreign Application Priority Data

May 15, 2019    (CN) .......................... 201910401332.3

(51) Int. Cl.
| | | |
|---|---|---|
| C23C 16/50 | (2006.01) | |
| B05B 7/02 | (2006.01) | |
| B05B 7/00 | (2006.01) | |
| C23C 16/455 | (2006.01) | |
| C23C 16/458 | (2006.01) | |

(52) U.S. Cl.
CPC .............. *B05B 7/02* (2013.01); *B05B 7/0075* (2013.01); *C23C 16/4583* (2013.01); *C23C 16/45565* (2013.01); *C23C 16/50* (2013.01)

(58) Field of Classification Search
CPC ........ C23C 16/45574; C23C 16/45576; C23C 16/45565; B04B 7/0075
See application file for complete search history.

(56) References Cited

U.S. PATENT DOCUMENTS

2007/0221129 A1 *   9/2007   Bae .................... C23C 16/45574
                                                          118/715
2009/0095221 A1 *   4/2009   Tam .................. C23C 16/45565
                                                          118/715

FOREIGN PATENT DOCUMENTS

KR    2009/071729    *    7/2008

* cited by examiner

*Primary Examiner* — Joseph A Miller, Jr.
(74) *Attorney, Agent, or Firm* — Locke Lord LLP; Tim Tingkang Xia, Esq.

(57) ABSTRACT

The invention discloses a showerhead assembly including a male board with a top surface and a bottom surface and having an injector extending from the bottom surface to inject a first gas; and a female board with a top surface and a bottom surface and having a cavity formed on the top surface. The cavity is communicatively coupled to a gas outlet through which a second gas is guided toward to the outlet. The cavity is configured to receive the first gas from the male board such that the first gas and the second gas mix and then is exhausted via the gas outlet.

11 Claims, 3 Drawing Sheets

MULTIPLE SECTION SHOWERHEAD ASSEMBLY

CROSS-REFERENCE TO RELATED APPLICATIONS

This non-provisional application claims priority under 35 U.S.C. § 119(a) on Patent Application No(s). 201910401332.3 filed in China (ROC) on May 15, 2019, the entire contents of which are hereby incorporated by reference.

BACKGROUND OF THE INVENTION

Field of the Invention

The invention relates to a multiple section showerhead assembly, particularly to a multiple section showerhead with each nozzle providing a mixed gas composed of at least two substances.

Description of the Prior Art

In the field of high integration semiconductor device manufacturing, requirement of precision in various processes is highly demanded, such as thickness and evenness control in film depositing process.

In CVD process, the semiconductor manufacturing apparatus provides a showerhead assembly to supply a reaction gas onto a substrate surface to form a thin film. An advanced showerhead is able to supply a mixed gas, i.e. at least two gases can be mixed in the showerhead assembly and will be released via nozzles to the processing region of the substrate. The mixture may include various gases. For example, the reaction gas may include substances for forming a thin film and inert gases for controlling gas flow without participating in chemical reaction. In addition, the mixture may include a purge gas that can be used to determine an overall gas flow and prevent particles from staying in the undesired structure. Contamination can be avoided by evenly ejecting the purge gas.

A conventional post-mixing showerhead assembly mixes multiple gases therein and then ejects the mixture to the reaction region of the chamber to chemically react with the substrate surface. A conventional nozzle is designed to have multiple outlets. For example, a single nozzle may have a central gas outlet mainly for releasing reaction gas and its surrounding may be provided with an outlet for releasing purge gas. This configuration is able to prevent particles from being accumulated at the end of the nozzle. In other conventional example, there is a method that is used to release different gases through different nozzles of the showerhead into the chamber. However, these designs cause the nozzles occupies a relatively large area of the showerhead. In the case where the size of showerhead is restricted, a compact nozzle layout design may be difficult. In other words, the nozzle density cannot be increased to meet the required gas substance density or uniformity within the reaction area, such as plasma density or thermally controlled reaction area. This becomes a barrier for precise semiconductor manufacture.

Therefore, there is a demand for showerhead design that is able to satisfy high reaction mixture gas density in order to overcome the restriction in semiconductor deposition process.

SUMMARY OF THE INVENTION

The invention proposes a showerhead assembly having a gas outlet for supplying a mixed gas, the showerhead assembly includes a male board and a main board. The male board has a top surface and a bottom surface, wherein the bottom surface of the male board has an injecting terminal formed thereon and the injecting terminal extends from the bottom surface of the male board to inject a first gas. The main board has a top surface and a bottom surface, wherein the top surface of the main board has a recess formed thereon, the recess communicatively couples to the gas outlet to guide a second gas flowing from the top surface of the main board toward the gas outlet. The recess is configured to receive the first gas from the male board such that the first gas and the second gas are mixed within the recess and released via the gas outlet.

In one embodiment, the male board has a flow channel defined between the top surface and the injecting terminal thereof in order to guide a first gas from the top surface of the male board to the injecting terminal of the male board.

In one embodiment, the flow channel has a first segment and a second segment, the second segment is defined at the injecting terminal and has a diameter larger than that of the first segment.

In one embodiment, the bottom surface of the male board and the top surface of the main board define a channel for the second gas, and the recess is a part of the channel.

In one embodiment, the gas outlet has a diameter larger than that of the second segment of the flow channel.

In one embodiment, the injecting terminal and a wall of the recess define a gap therebetween, the gap communicates with the channel for guiding the second gas, the flow channel for guiding the first gas and the gas outlet for guiding the mixed gas.

In one embodiment, the gas outlet is located at the center of the showerhead assembly.

The invention further proposes a showerhead assembly having a gas outlet for supplying a mixed gas, the showerhead assembly includes a male board and a main board. The male board having a top surface and a bottom surface, wherein the bottom surface of the male board has an injecting terminal formed thereon, the injecting terminal extends from the bottom surface of the male board to inject a first gas. The main board having a top surface and a bottom surface with a recess formed on the top surface thereof, the recess receiving the a part of the injecting terminal such that a wall defining the recess and the injecting terminal define a flow path for a second gas, whereby the first gas from the injecting terminal and the second gas are pushed from the recess to the gas outlet communicated with the recess.

In one embodiment, the recess of the board is configured to fit another injecting terminal of another board.

More details of these and other features and advantages will be presented in the following description and drawings exemplified by the principle of the present invention.

BRIEF DESCRIPTION OF THE DRAWINGS

With the following drawings and description, one can further realize the present invention. Embodiments that do not restrict and exhaust the present invention will be described in accordance with the following figures. Elements illustrated in the figures may not necessarily be depicted in their exact scale; instead, the statement of their structure and theory is primary.

DETAILED DESCRIPTION OF THE PREFERRED EMBODIMENTS

The following description will explain the present invention more fully with reference to the appended drawings, and will show certain embodiments by way of examples. However, the subject matter of the present invention may be embodied in various forms, and the present invention shall not be limited by any exemplary embodiments disclosed herein. The embodiments described herein are for exemplary purposes only. Similarly, the present invention shall be construed in a reasonably broad manner. In addition, as the subject matter of the present invention may be embodied as a method, device or system, the embodiments described herein may include examples in the form of hardware, software, firmware or any combination thereof (but excluding software-only scenarios).

The phrase "in one embodiment" as used herein does not necessarily refer to the same embodiment being described. Similarly, the phrase "in another embodiment" does not necessarily refer to a different embodiment from the one being described. The claimed subject matter may include all the elements described in an exemplary embodiment, or a combination of part of the elements described in an exemplary embodiment.

Figure 1:
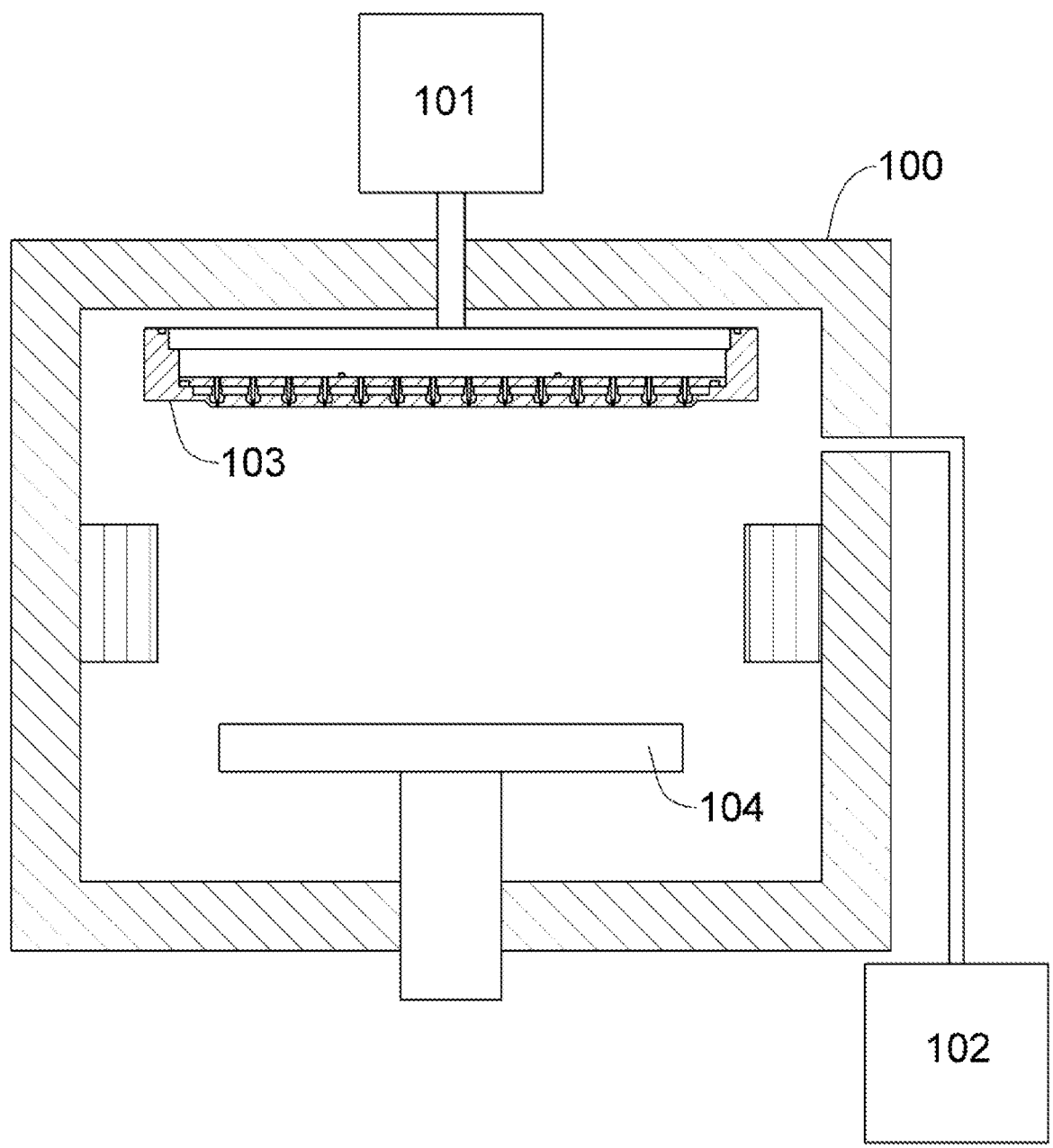
FIG. 1 illustrates a semiconductor processing chamber with a showerhead according to the invention.

FIG. 1 illustrates a schematic view showing a semiconductor processing apparatus according to the invention, particularly a CVD dedicated processing chamber for depositing thin film. However, other processes may be included, such as etching process and cleaning process, and continuously sequenced processes that take place within the same chamber. The semiconductor processing chamber of FIG. 1 includes a chamber (100) defined by an enclosed structure that receives a processing gas from one or more gas resources (101) and communicates with an exhaust system (102) to achieve vacuum within the chamber. The top of the chamber (100) is provided with a gas supply assembly. In this figure, only a showerhead assembly (103) of the gas supply assembly is shown, which receives one or more gases from the gas resource (101), such as reaction gas or inert gas. The showerhead assembly (103) releases said gas to a processing region in the chamber to carry out film deposition. The bottom of the chamber (100) is provided with a pedestal (104) for supporting a substrate or wafer in the processing region to be deposited. The showerhead assembly (103) facing the substrate is a terminal of the gas supply assembly and ejects the processing gas. Despite not being shown in the figure, one skilled in the art is supposed to realize more elements and devices may be included in the chamber, such as a heater, an exhaust channel and a sensor. The following content describes more details of the showerhead assembly (103). In addition, in PECVD application, the showerhead assembly (103) and the pedestal (104) further include electrodes that are coupled to an RF circuit and a matching box.

Figure 2:
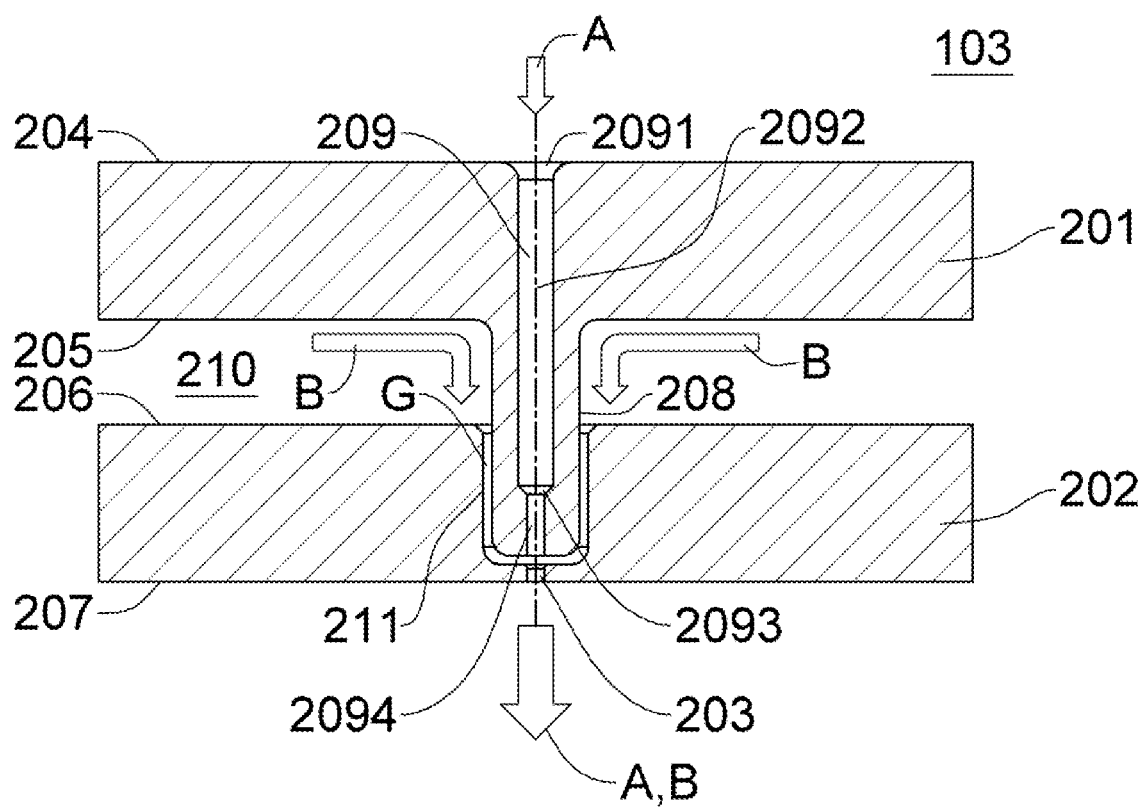
FIG. 2 illustrates a cross-sectional view showing a part of showerhead of one embodiment according to the invention.

FIG. 2 shows further details of the embodied showerhead assembly (103) of FIG. 1. The showerhead assembly (103) includes a male board (201) and a main board (202). The male board (201) can be mounted on the main board (202) by threading or engaging elements. The main board (202) is the lowest part of the showerhead assembly (103). The main board (202), the pedestal (104) and side walls of the chamber (100) as shown in FIG. 1 define said reaction region. The main board (202) includes one more gas outlets configured to release processing gas to the substrate on the pedestal (104). FIG. 2 only illustrates single one gas outlet (203) of the showerhead assembly (103), i.e. a single one nozzle. The male board (201) has a top surface (204) and a lower surface (205), the main board (202) has a top surface (206) and a lower surface (207). The lower surface (205) of the male board (201) and the top surface (206) of the main board (202) are parallel to each other. The upside of the male board (201) is an air chamber (not shown) communicatively coupled to the gas resource (101) as shown in FIG. 1 from which the gas is supplied to the showerhead assembly (103).

The male board (201) has an injecting terminal (208) formed at the bottom surface thereof and co-axial with the gas outlet (203). The injecting terminal (208) extends from the bottom surface (205) of the male board (201) in order to inject a first gas (A). The first gas (A) can be supplied by the air chamber above the male board (201). The male board (201) has a flow channel (209) that extends from the top surface (204) to the injecting terminal (208) of the bottom surface (205). Hence, the total length of the flow channel (209) is larger than the thickness of the male board (201). The injecting terminal (208) extends toward the top surface (206) of the main board (202) without contacting with the main board (202). The illustrated injecting terminal (208) is shaped in a column but could be a cone or other shapes that fit the main board (202). The flow channel (209) is configured to guide the first gas to pass through the male board (201). The flow channel (209) is defined by different segments with different radiuses. As shown in figure, the flow channel (209) includes, from the upstream end to downstream end, a first funnel segment (2091), a first segment (2092), a second funnel segment (2093) and a second segment (2094), wherein the radius of the first segment (2092) is larger than the radius of the second segment (2094), while the radius of the second segment (2094) is less than or equal to the radius of the gas outlet (203). In other embodiments, the flow channel (209) may be defined by more or less segments.

The male board (201) and the main board (202) are separated by a distance such that a channel (210) for supplying a second gas (B) is defined by the bottom surface (205) of the male board (201) and the top surface (206) of the main board (202), the channel (210) communicatively couples to a gas resource (not shown) of the second gas. Hence, the second gas (B) stays between the male board (201) and the main board (202) after entering the showerhead assembly and then passes through the main board (202) to the processing region. The top surface of the main board (202), co-axial with the gas outlet (203), has a recess (211) that communicatively couples to the gas outlet (203) in order to guide the second gas (B) flowing from the top surface of the main board (202) to the gas outlet (203). The recess (211) extends downwardly from the top surface of the main board (202) without penetrating the main board (202). The recess (211) may be deemed as a part of the channel (210) that carries the second gas. The recess (211) is also configured to receive the first gas from the male board (201) such that the first gas (A) and the second gas (B) are mixed thin the recess (211) and then be released into the process zone.

The shape of recess (211) is similar to that of the injecting terminal (208) and has a radius slightly larger than that of the injecting terminal (208). The male board (201) and the main board (202) are positioned according to the foregoing distance such that a part of the injecting terminal (208) of the male board (201) positioned above the main board (202) is able to extend into the recess (211), and a gap (G) is formed between the injecting terminal (208) and the wall defining the recess (211). That is, the injecting terminal (208) is not in contact with the main board (202). Thereby, the gap (G) is similar to a U shape. The second gas (B) flows to the gas outlet (203) via the gap (G). The flow channel (209) of the injecting terminal (208) guides the first gas (A) toward the bottom of the gap (G) within the recess (211). As a result, the first gas (A) and the second gas (B) are met at the recess (211) of the main board (202). Preferably, the first gas (A) and the second gas (B) are met near the bottom of the gap (G), which reduces a required path that both gases lead to the gas outlet (203). In one embodiment, the first gas (A) is an inert gas, a purge gas or other gases, the second gas (B) is a reaction gas. The mixture of the first gas (A) and the second gas (B) is released to the processing region merely through a single gas outlet (203).

Figure 3:
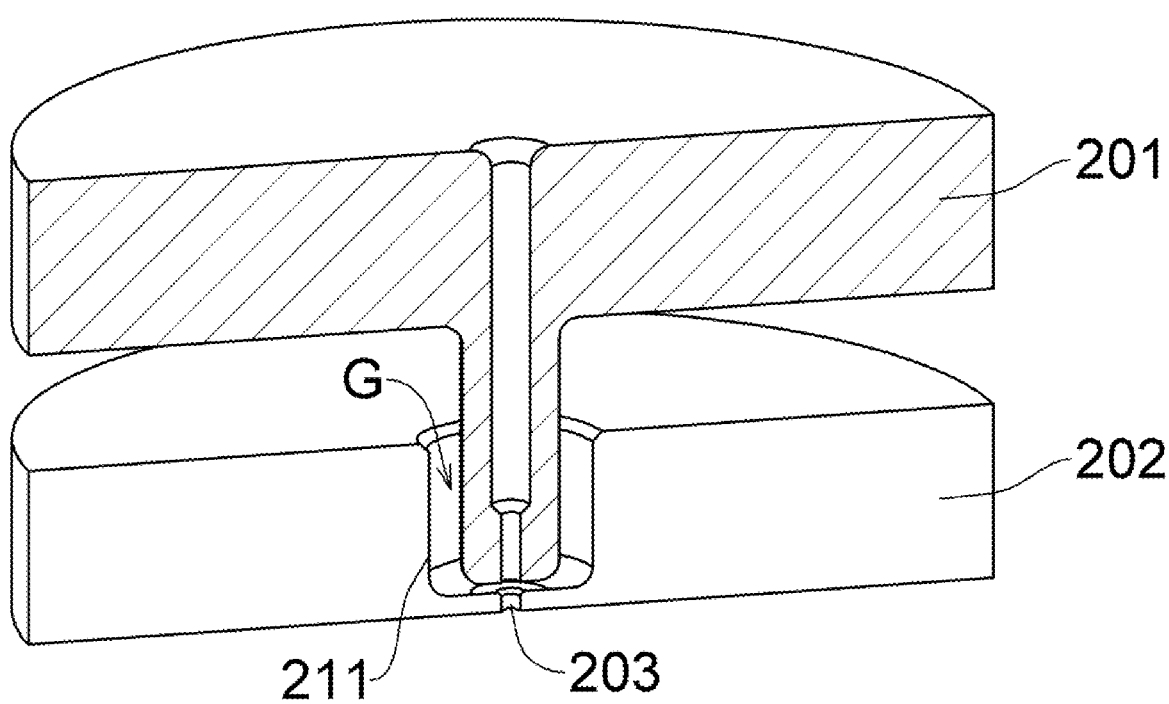
FIG. 3 illustrates another cross-sectional view showing a part of showerhead of one embodiment according to the invention.

FIG. 3 shows another cross-sectional view of the showerhead assembly (103), which illustrates the recess has a relatively large radius in one direction such that the gap (G) between the injecting terminal (208) and the wall defining the recess (211) is actually larger than that shown in FIG. 2. It is noted that said recess (211) does not necessarily has same radius. Despite not shown in the figure, a lateral cross-section of the recess (211) can be circle, ellipse or rectangular. The non-circle recess (211) is the design to solve certain problem. In a PECVD case where a showerhead assembly may include an RF electrode while carries gases that have been heated, these factors can increase temperature of the showerhead assembly, causing thermal expansion in the male board (201) and the main board (202). To prevent the injecting terminal (208) from blocking the recess (211) due to thermal expansion, the recess (211) may be designed to be non-circle, i.e. the recess (211) has a radius in one direction larger than another radius in another direction. This ensures the gap (G) that is sufficient to supply gas to the gas outlet (203). In other possible embodiments, changing the injecting terminal (208) in shape may be another feasible way.

Figure 4:
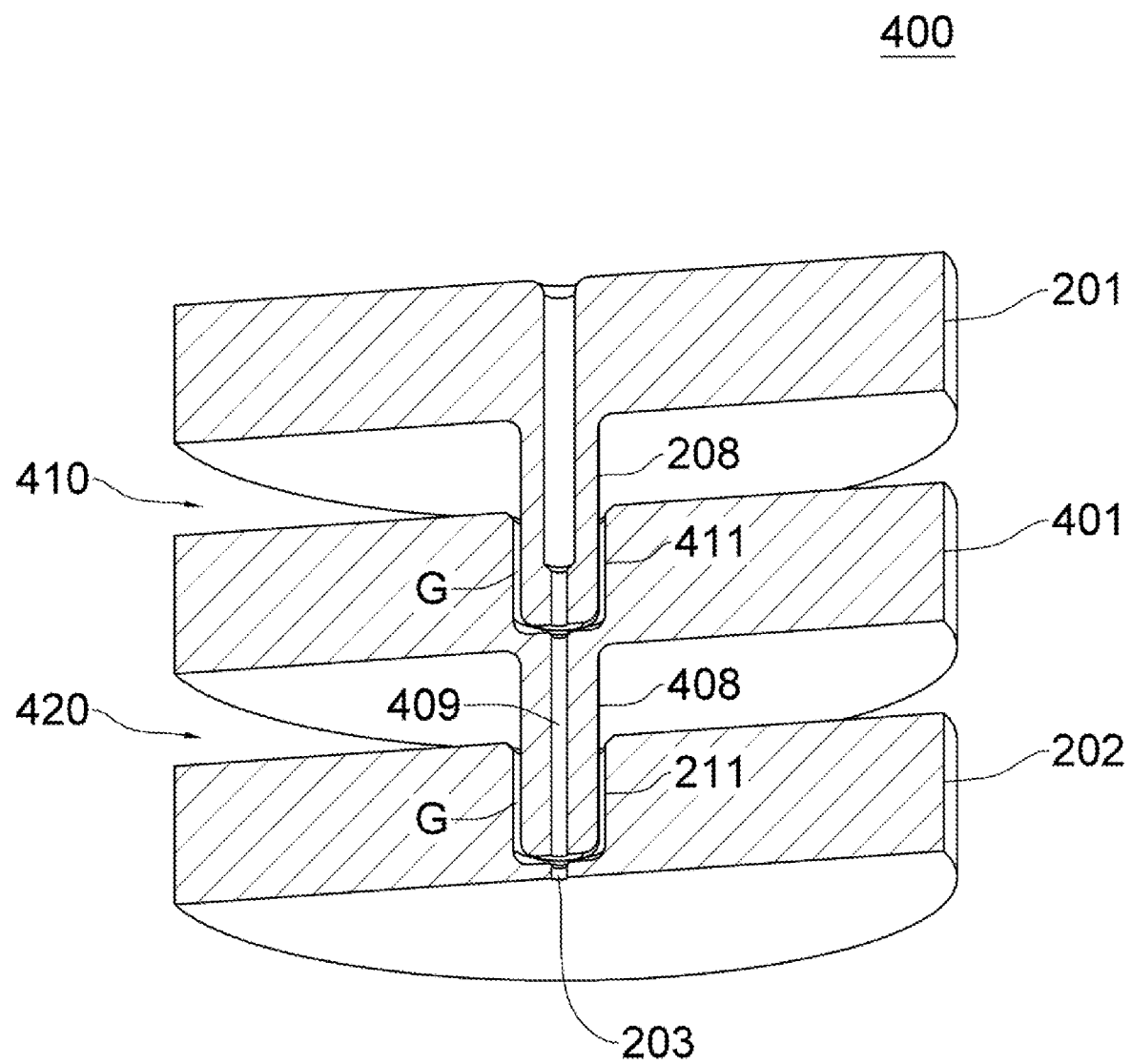
FIG. 4 illustrates another embodiment of the showerhead according to the invention.

FIG. 4 illustrates another embodiment of the showerhead according to the invention, which may be adaptive for mixture of more gases. The figure shows a cross-section view of only single one gas outlet (203) of the showerhead assembly (400). The showerhead assembly (400) may have other securing elements around its periphery as shown in FIG. 1 so as to stack the boards and secure the showerhead assembly at the top of chamber. A difference as compared with the foregoing embodiments, the showerhead assembly (400) includes more stacks as shown in FIG. 4. A board (401) is positioned between the male board (201) and the main board (202), particularly the board (401) has features of both male board (201) and the main board (202). The board (401) has a top surface and a bottom surface (not numbered). The top surface of the board (401) and the bottom surface of the male board (201) define a first channel (410), the bottom surface of the board (410) and the top surface of the main board (202) define a second channel (420). The board (401) has a recess (411) formed on the top surface thereof while an injecting terminal (408) formed on the bottom surface thereof co-axially with the gas outlet (203). The recess (411) and the injecting terminal (408) have similar configuration so as to fit the injecting terminal (208) of the male board (201) and the recess (211) of the main board (202) respectively while maintain said gap (G).

A first gas can enter the recess (411) via the flow channel (209) of the male board (201), a second gas can enter the recess (411) via the first channel (410). Hence, the first and second gases are met in the recess (411) and move forward to the flow channel (409) extending between the recess (411) and the injecting terminal (408). The flow channel (209) of the male board (201) has a downstream diameter that is smaller than the upstream diameter of the flow channel (409) of the board (401). In this way, the first and second gases can smoothly enter into the board (401) and mix together. The mixture of first and second gases enters into the recess (211) of the main board (202) via the flow channel (409) of the board (401). A third gas enters into the recess (211) via the second channel (420). Thus, the mixture of first and second gases as well as the third gas are met in the recess (211). The mixture of the three gases finally is released via the single one gas outlet (203) of the main board (202).

In one embodiment, the showerhead assembly has a plurality of gas outlets, each of which is designed with the male board and the main board in order to supply a mixed gas. In other embodiments, the showerhead assembly has a single gas outlet distributed at its center to evenly release the mixed gas to the processing region. In view of the conventional configuration, the gas outlets of the mixed gas according to the invention is able to occupy a relatively small area, and a design of high-density nozzle layout becomes possible. The diameter of the injecting terminal may be adaptively reduced to permit said high-density layout design. In possible embodiments, all flow channels in one board can be communicated inside with each other in order to balance the gas pressure at respective positions.

The foregoing content provides a complete description of combination and use of the described embodiments. These embodiments will exist within the following claims since more embodiments may be created without departure from the scope and spirit as described herein.

What is claimed is:

1. A showerhead assembly having a gas outlet for supplying a mixed gas, the showerhead assembly comprising:
   a male board having a top surface and a bottom surface, wherein the bottom surface of the male board has an injecting terminal formed thereon and the injecting terminal extends from the bottom surface of the male board to inject a first gas; and
   a main board having a top surface and a bottom surface, wherein the top surface of the main board has a recess formed thereon without penetrating completely through the main board, the recess communicatively couples to the gas outlet to guide a second gas flowing from the top surface of the main board toward the gas outlet, the recess is configured to receive the first gas from the male board with the injecting terminal terminates above a bottom of the recess without contacting the main board such that the first gas and the second gas are mixed at the bottom of the recess and released via the gas outlet.

2. The showerhead assembly as claimed in claim 1, wherein the male board has a flow channel defined between the top surface and the injecting terminal thereof in order to guide a first gas from the top surface of the male board to the injecting terminal of the male board.

3. The showerhead assembly as claimed in claim 2, wherein the flow channel has a first segment and a second segment, the second segment is defined at the injecting terminal and has a diameter larger than that of the first segment.

4. The showerhead assembly as claimed in claim 1, wherein the bottom surface of the male board and the top surface of the main board define a channel for the second gas, and the recess is a part of the channel.

5. The showerhead assembly as claimed in claim 3, wherein the gas outlet has a diameter larger than that of the second segment of the flow channel.

6. The showerhead assembly as claimed in claim 1, wherein the injecting terminal and a wall of the recess define a gap therebetween, the gap communicates with the channel for guiding the second gas, the flow channel for guiding the first gas and the gas outlet for guiding the mixed gas.

7. The showerhead assembly as claimed in claim 1, wherein the gas outlet is located at the center of the showerhead assembly.

8. A showerhead assembly having a gas outlet for supplying a mixed gas, the showerhead assembly comprising:
   a male board having a top surface and a bottom surface, wherein the bottom surface of the male board has an injecting terminal formed thereon, the injecting terminal extends from the bottom surface of the male board to inject a first gas; and
   a main board having a top surface and a bottom surface with a recess formed on the top surface thereof, the recess without penetrating completely through the main board receiving a part of the injecting terminal that terminates above a bottom of the recess such that a wall defining the recess and the injecting terminal define a flow path for a second gas, whereby the first gas from the injecting terminal and the second gas are collected at the bottom of the recess and then flow to the gas outlet communicated with the recess.

9. The showerhead assembly as claimed in claim 8, wherein the male board has a flow channel defined between the top surface and the injecting terminal thereof in order to guide the first gas entering from the top surface of the male board to the injecting terminal of the bottom surface of the male board.

10. The showerhead assembly as claimed in claim 8, wherein the flow channel has a first segment and a second segment, the second segment is defined at the injecting terminal and has a diameter larger than that of the first segment.

11. The showerhead assembly as claimed in claim 8, wherein the bottom surface of the male board and the top surface of the main board define a channel for the second gas, and the recess is a part of the channel.

\* \* \* \* \*